() United States Patent  
Islam et al.

US006174810B1

(10) Patent No.: US 6,174,810 B1
(45) Date of Patent: *Jan. 16, 2001

(54) COPPER INTERCONNECT STRUCTURE AND METHOD OF FORMATION

(75) Inventors: Rabiul Islam, Austin, TX (US); Avgerinos V. Gelatos, Redwood City, CA (US); Kevin Lucas, Austin, TX (US); Stanley M. Filipiak, Pflugerville, TX (US); Ramnath Venkatraman, Austin, TX (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/055,510

(22) Filed: Apr. 6, 1998

(51) Int. Cl.[7] .................................................. H01L 21/44

(52) U.S. Cl. .......................... 438/687; 624/636; 624/622; 624/786

(58) Field of Search .................................... 438/626, 687, 438/634, 622, 624, 786, 636, 72

(56) References Cited

U.S. PATENT DOCUMENTS

| 4,714,668 | | 12/1987 | Uneno et al. ........................ 430/316 |
| 4,931,410 | * | 6/1990 | Tokunaga et al. ................... 438/618 |
| 5,084,412 | * | 1/1992 | Nasaki .................................. 438/656 |
| 5,378,659 | | 1/1995 | Roman et al. ....................... 437/229 |
| 5,447,887 | | 9/1995 | Filipiak et al. ..................... 437/200 |
| 5,488,246 | | 1/1996 | Hayashide et al. ................ 257/336 |
| 5,612,254 | * | 3/1997 | Mu et al. ............................ 438/634 |
| 5,677,111 | * | 10/1997 | Ogawa ................................ 430/313 |
| 5,744,376 | * | 4/1998 | Chan et al. ......................... 438/626 |
| 5,821,168 | * | 10/1998 | Jain ..................................... 438/692 |
| 5,831,321 | * | 11/1998 | Nagayama ......................... 257/412 |
| 5,893,752 | * | 4/1999 | Zhang et al. ....................... 438/687 |
| 6,071,813 | * | 6/2000 | Nogami .............................. 438/687 |

FOREIGN PATENT DOCUMENTS

0588087A2    3/1994    (EP)  ............................ H01L/21/027

OTHER PUBLICATIONS

Johnson, et al., "Plasma–Enhanced CVD Silicon Nitride Antireflection Coatings for Solar Cells", Solar Energy, vol. 31, No. 4, pp. 355–358 (1983).

Nolscher, et al., "High Contrast Single Layer Resists and Antireflection Layers—An Alternative to Multilayer Resist Techniques", SPIE, vol. 1086 Advances in Resist Technology and Processing VI pp. 242–250 (1989).

Dijkstra, et al., "Optimization of Anti–Reflection Layers for Deep UV Lithography", SPIE, vol. 1927 Optical/Laser Microlithography VI, pp. 275–286 (1993).

Czech, et al. "Reduction of Linewidth Variation for the Gate Conductor Level by Lithography Based on a New Antireflective Layer", Microelectronic Engineering, vol. 21, pp. 51–56 (1993).

(List continued on next page.)

*Primary Examiner*—Carl Whitehead, Jr.
*Assistant Examiner*—Maria Guerrero
(74) *Attorney, Agent, or Firm*—Keith Witek (57) ABSTRACT

In one embodiment, a copper interconnect structure is formed by depositing a dielectric layer (28) on a semiconductor substrate (10). The dielectric layer (28) is then patterned to form interconnect openings (29). A layer of copper (34) is then formed within the interconnect openings (29). A portion of the copper layer (34) is then removed to form copper interconnects (39) within the interconnect openings (29). A copper barrier layer (40) is then formed overlying the copper interconnects (39). Adhesion between the copper barrier layer (40) and the copper interconnects (39) is improved by exposing the exposed surface of the copper interconnects (39) to a plasma generated using only ammonia as a source gas.

13 Claims, 5 Drawing Sheets

OTHER PUBLICATIONS

Ogawa, et al., "Practical Resolution Enhancement Effect by New Complete Anti–Reflective Layer in KrF Excimer Laser Lithography", SPIE, vol. 1927 Optical/Laser Microlithography VI, pp. 263–274 (1993).

Ogawa, et al., "SiOxNy:H, High Performance Anti–Reflective Layer for the Current and Future Optical Lithography", SPIE, vol. 2197, pp. 722–732.

Singer, "Making the Move to Dual Damascene Processing", Semiconductor International, pp. 79–80, 82 (1997).

Yasushi Sawada et al., "The reduction of copper oxide thin films with hydrogen plasma generated by an atmospheric–pressure glow discharge", 1996 IOP Publishing Ltd., pp. 2539–2544.

M. Valente et al., "A Study of Contamination during Reactive Ion Etching of SIO2", May 1984 J. Electrochem. Soc.: Solid State Science Technology, vol. 131, No. 5, pp. 1132–1135.

* cited by examiner

COPPER INTERCONNECT STRUCTURE AND METHOD OF FORMATION

FIELD OF THE INVENTION

This invention relates generally to semiconductor devices, and more specifically to a copper interconnect structure within a semiconductor device and its method of formation.

BACKGROUND OF THE INVENTION

In the semiconductor industry, conductive interconnects have traditionally been formed using aluminum. However, conductive interconnects having a resistance lower than that given by aluminum are now required to meet the speed requirements of advanced semiconductor devices. Copper has recently been proposed as a replacement for traditional aluminum interconnects because of its lower resistance. Copper unlike aluminum, is highly mobile in many of the materials that are currently used to fabricate semiconductor devices. Thus, the use of copper interconnects in semiconductor devices requires the use of copper barrier layers to prevent unwanted copper diffusion within the semiconductor device. Adhesion of the barrier layer to the copper interconnect, however, is problematic and frequently causes semiconductor devices to fail. Therefore, a need exists for a metallization process that allows semiconductor devices with improved reliably to be fabricated with copper interconnects.

DETAILED DESCRIPTION OF THE DRAWINGS

Figure 1:
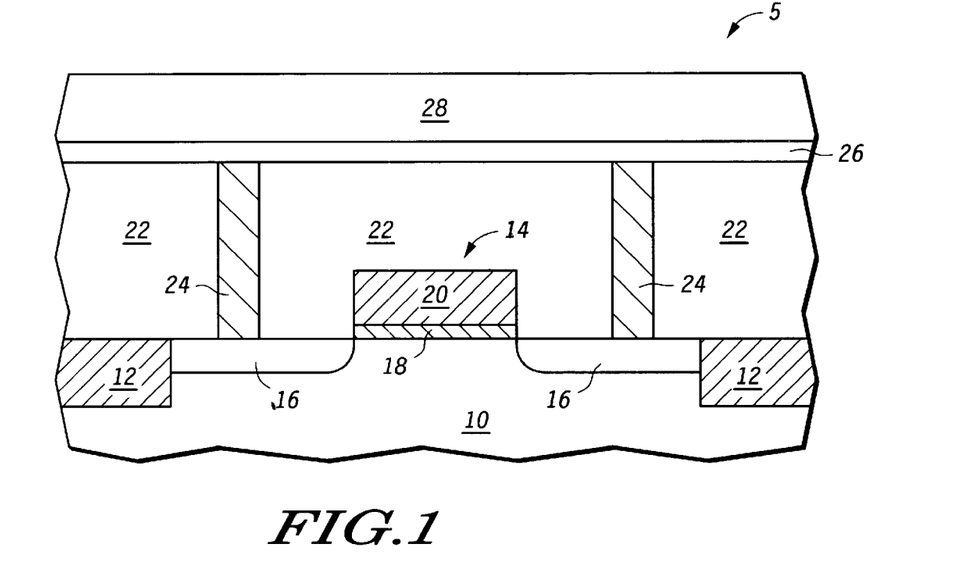
FIGS. 1–7 illustrate, in cross-section, process steps in accordance with one embodiment of the invention.

Shown in FIG. 1 is a portion 5 of a semiconductor device structure in accordance with one embodiment of the present invention. The semiconductor device structure comprises a semiconductor substrate 10, field isolation regions 12, a transistor 14, conductive plugs 24, a dielectric layer 22, an etch stop layer 26, and a dielectric layer 28. Transistor 14 comprises source/drain regions 16, a gate dielectric layer 18, and a gate electrode 20. In one embodiment, semiconductor substrate 10 is a monocrystalline silicon substrate. Alternatively, semiconductor substrate 10 may be a silicon-on-insulator substrate, a silicon-on-sapphire substrate, or the like.

In one embodiment, field isolation regions 12 are trench isolation regions which are formed using conventional etching and chemical mechanical polishing techniques. Alternatively, field isolation regions 12 may be field oxide regions which are formed using conventional techniques, such as local oxidation of silicon (LOCOS), poly-buffered LOCOS (PBL), polysilicon encapsulated local oxidation (PELOX), or the like.

In one embodiment, gate dielectric layer 18 is a layer of thermal silicon dioxide which is formed by thermally oxidizing a portion of semiconductor substrate 10. Alternatively, gate dielectric layer 18 may be a layer of silicon nitride, a layer of silicon oxynitride, a layer of chemically vapor deposited silicon dioxide, a nitrided oxide layer, or a combination thereof.

In one embodiment, gate electrode 20 is a layer of polysilicon. Alternatively, gate electrode 20 may be a metal layer, such as tungsten or molybdenum, a metal nitride layer, such as titanium nitride or tungsten nitride, or a combination thereof. In addition, gate electrode 20 may be a polycide layer comprising a metal silicide layer, such as tungsten silicide, titanium silicide, or cobalt silicide, overlying a polysilicon layer.

In one embodiment, dielectric layer 22 is a layer of plasma deposited oxide which is formed using TEOS as a source gas. Alternatively, dielectric layer 22 may be a layer of silicon nitride, a layer of PSG, a layer of BPSG, an SOG layer, a silicon oxynitride layer, a polyimide layer, or a combination thereof.

In one embodiment, conductive plugs 24 are formed using a titanium/titanium nitride barrier layer and a tungsten contact fill. After being deposited portions of the tungsten and the underlying titanium/titanium nitride barrier layer are removed using conventional etching or chemical mechanical polishing techniques to form conductive plugs 24. Alternatively, conductive plugs 24 may be formed using polysilicon as a contact fill material.

In one embodiment, etch stop layer 26 is a layer of silicon oxynitride which is formed using conventional plasma deposition techniques. Alternatively, etch stop layer 26 may be a layer of plasma deposited silicon nitride, a boron nitride layer, or the like.

In one embodiment, dielectric layer 28 is a layer of plasma deposited oxide which is formed using TEOS as a source gas. Alternatively, dielectric layer 28 may be a layer of silicon nitride, a layer of PSG, a layer of BPSG, an SOG layer, a silicon oxynitride layer, a polyimide layer, or the like. In addition, a combination of the foregoing dielectric materials may also be used to form dielectric layer 28.

Figure 2:
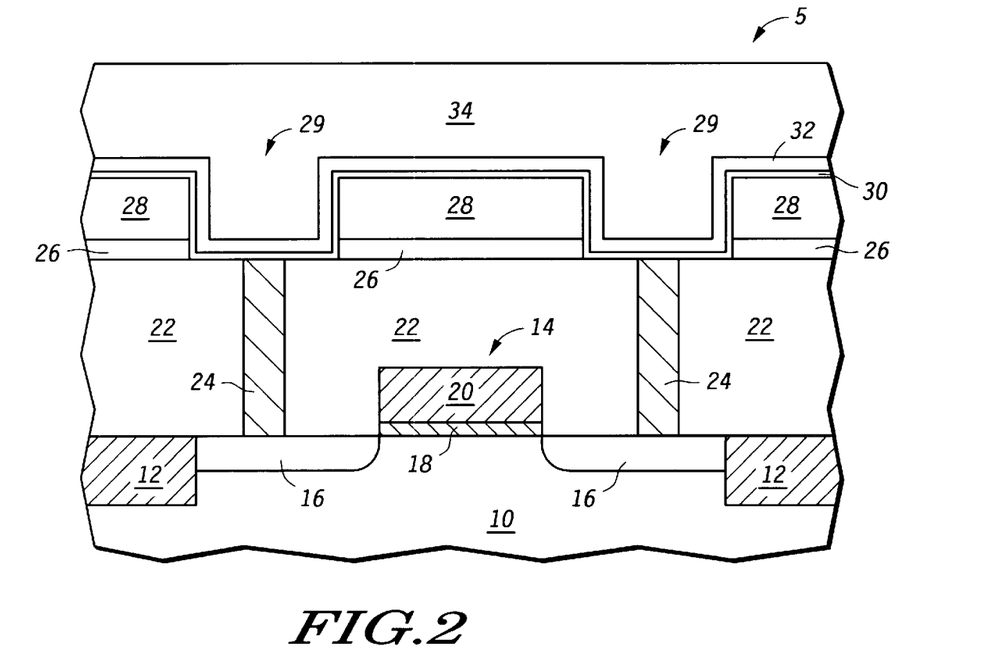

In FIG. 2, a portion of dielectric layer 28 and a portion of etch stop layer 26 are then removed to expose a portion of conductive plugs 24 and form interconnect openings 29. A conductive barrier layer 30 is then formed within interconnect openings 29. In one embodiment, conductive barrier layer 30 is a layer of tantalum nitride. Alternatively, conductive barrier layer 30 may be a layer of titanium nitride, a layer of tungsten nitride, a layer of tantalum silicon nitride, a layer of tantalum, a titanium-tungsten layer (TiW), or the like. Conductive barrier layer 30 may be deposited using conventional sputtering or chemical vapor deposition techniques.

A first copper layer 32 is then formed overlying conductive barrier layer 30. First copper layer 32 has a thickness which is insufficient to fill interconnect openings 29, as shown in FIG. 2. In one embodiment, first copper layer 32 is deposited using a sputter deposition process. Alternatively, first copper layer 32 may be formed using a chemical vapor deposition process.

An electroplating process is then used to form a second copper layer 34 overlying first copper layer 32. Second copper layer 34 has a thickness which is sufficient to fill interconnect openings 29, as shown in FIG. 2. In one embodiment, second copper layer 34 is deposited using a plating solution comprising copper (Cu), copper sulfate ($Cu_2SO_4$), sulfuric acid ($H_2SO_4$), and chloride ions, such as those from hydrochloric acid (HCl). In this particular embodiment, the electric current density is modified near the edges of the semiconductor substrate during the copper electroplating process in order to improve the copper electroplating uniformity, as is described in U.S. patent application Ser. No. 08/856,459, which is assigned to the assignee of the present application. The subject matter of U.S. patent application Ser. No. 08/856,459 is expressly incorporated herein by reference. Alternatively, second copper layer 34 may be formed using other electroplating techniques and other electroplating solutions. In addition, second copper layer 34 may be formed using other techniques, such as chemical vapor deposition.

Figure 3:
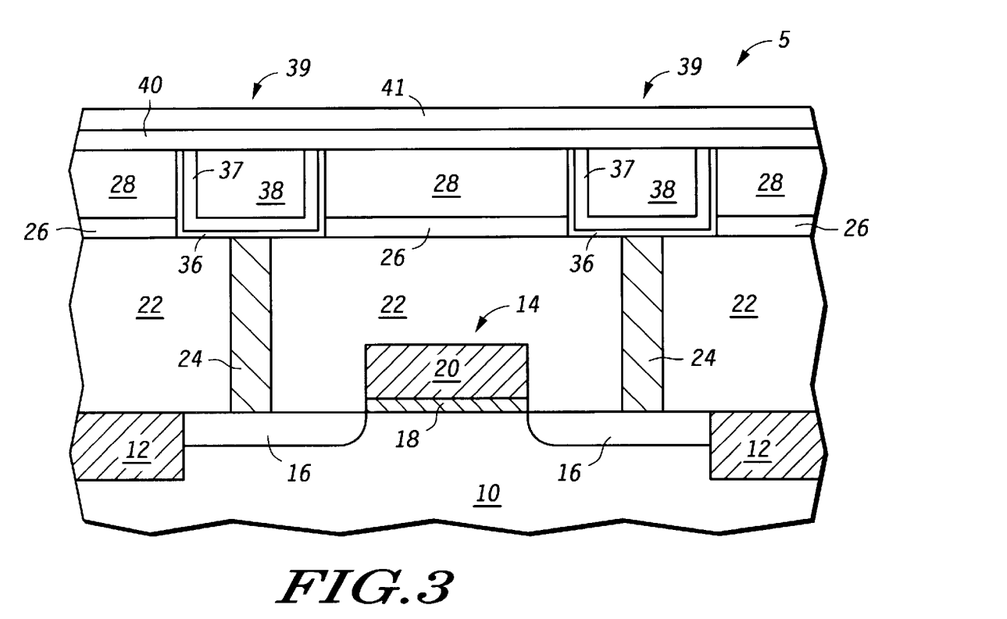

In FIG. 3, portions of second copper layer 34, first copper layer 32 and conductive barrier layer 30 are removed to form copper interconnects 39 within interconnect openings 29, wherein copper interconnects 39 comprise a remaining portion 36 of conductive barrier layer 30, a remaining portion 37 of first copper layer 32, and a remaining portion 38 of first copper layer 34. In particular embodiments wherein conductive barrier layer 30 comprises titanium, tungsten, or tantalum, copper interconnects 39 may be formed with a chemical mechanical polishing process that uses a polishing slurry comprising hydrogen peroxide, ammonium citrate, alumina, 1,2,4-triazole, and deionized water, as is described in U.S. patent application Ser. No. 08/954,190, which is assigned to the assignee of the present application. The subject matter of U.S. patent application Ser. No. 08/954,190 is expressly incorporated herein by reference. Alternatively, copper interconnects 39 may be formed using conventional etching techniques, such as ion-beam milling, reactive ion-beam etching, and plasma etching, or using a combination of etching and polishing techniques.

A copper barrier layer 40 comprising silicon and nitrogen is then formed overlying copper interconnects 39. Copper barrier layer 40 is used to prevent copper atoms within copper interconnects 39 from diffusing into dielectric layers which are subsequently deposited over copper interconnects 39. In one embodiment, copper barrier layer 40 has an absorption coefficient (k) that ranges from approximately 0.0 to approximately 0.15 for photoresist exposure wavelengths at or below 365 nanometers. More specifically, copper barrier layer 40 has an absorption coefficient (k) that ranges from approximately 0.0 to approximately 0.15 at photoresist exposure wavelengths of 365 nanometers and 248 nanometers.

In order to improve the adhesion between copper interconnects 39 and copper barrier layer 40, copper interconnects 39 are exposed to a silicon-free plasma that comprises hydrogen. The silicon-free plasma comprising hydrogen is generated using a silicon-free source gas or silicon-free source gases that are supplied to the plasma chamber. For example, in one embodiment a silicon-free plasma comprising hydrogen is generated using only ammonia ($NH_3$) as a source gas to generate a plasma consisting essentially of hydrogen and nitrogen. In this particular embodiment, the plasma consisting essentially of hydrogen and nitrogen is generated under the following conditions: a deposition pressure of approximately 8.0 torr; an ammonia flow rate of approximately 400 sccm; an RF power of approximately 200 watts; a spacing of approximately 650 mils, and a deposition temperature of approximately 400 degrees centigrade. Alternatively, a silicon-free plasma comprising hydrogen may be generated using only hydrogen ($H_2$) as a source gas or using hydrogen in combination with an inert source gas, such as nitrogen ($N_2$), helium (He), or argon (Ar). It is believed that the plasma process removes copper oxide from the exposed surface of copper interconnects 39, which can degrade adhesion between copper barrier layer 40 and copper interconnects 39. Specifically, it is believed that hydrogen in the plasma reacts with copper oxide on the surface of the copper interconnect to form volatile water which is pumped away, and nitrogen in the plasma assists in the reduction of the copper oxide by impinging on the copper surface. In addition, by performing this cleaning process within the same chamber as the subsequent copper barrier layer deposition, the cleaned copper surface is not re-exposed to air and re-oxidized prior to deposition. It is important to note that the foregoing plasma process improves adhesion without degrading the resistance of the copper interconnect and without degrading the leakage current between adjacent copper interconnects.

In one embodiment, copper barrier layer 40 is a layer of silicon oxynitride ($Si_xO_yN_z$). In this particular embodiment, copper barrier layer 40 is formed in an Applied Materials Centura plasma deposition system mounted with a DXZ chamber using the following deposition conditions: a deposition pressure of approximately 5.0 torr; a silane flow rate of approximately 73 sccm; a nitrous oxide flow rate of approximately 92 sccm; a nitrogen flow rate of approximately 3900 sccm; an RF power of approximately 500 watts; a spacing of approximately 475 mils, and a deposition temperature of approximately 400 degrees centigrade. At a photoresist exposure wavelength of approximately 365 nanometers the foregoing silicon oxynitride layer has a refractive index of approximately 1.66 and an absorption coefficient of approximately 0.0.

In an alternative embodiment, copper barrier layer 40 is a layer of plasma deposited silicon nitride ($Si_xN_y$). In this particular embodiment, copper barrier layer 40 is formed in an Applied Materials Centura plasma deposition system mounted with a DXZ chamber using the following deposition conditions: a deposition pressure of approximately 5.0 torr; a silane flow rate of approximately 100 sccm; an ammonia flow rate of approximately 140 sccm; a nitrogen flow rate of approximately 4000 sccm; an RF power of approximately 450 watts; a spacing of approximately 610 mils, and a deposition temperature of approximately 400 degrees centigrade. At a photoresist exposure wavelength of approximately 365 nanometers the foregoing silicon nitride layer has a refractive index of approximately 2.05 and an absorption coefficient of approximately 0.0.

It is important to note that copper barrier layer 40 may be reliably integrated with inlaid copper metallization because it adheres to copper interconnects 39 and because it does not adversely effect the resistance of copper interconnects 39 or the leakage current between adjacent inlaid copper interconnects. Specifically, it has been found that the leakage current between inlaid copper interconnects spaced approximately 2400 angstroms apart is less than one nanoampere when they are covered by copper barrier layer 40. Thus, the present invention also allows semiconductor devices having low leakage currents to be fabricated with copper interconnects.

In one embodiment, an antireflective layer 41 containing silicon and nitrogen is then formed abutting copper barrier layer 40. Antireflective layer 41 has a thickness ranging from approximately 5 nanometers to approximately 100 nanometers. Antireflective layer 41 has an absorption coefficient (k) that ranges from approximately 0.2 to approximately 1.0 for photoresist exposure wavelengths at or below 365 nanometers. Specifically, antireflective layer 41 has an absorption coefficient (k) that ranges from approximately 0.2 to approximately 1.0 at photoresist exposure wavelengths of 365 nanometers and 248 nanometers. Thus, for the same photoresist exposure wavelength, copper barrier layer 40 will have an absorptive coefficient which is less than the absorptive coefficient for antireflective layer 41.

In one embodiment, antireflective layer 41 is a layer of silicon oxynitride ($Si_xO_yN_z$). In this particular embodiment, antireflective layer 41 is formed in an Applied Materials Centura plasma deposition system mounted with a DXZ chamber using the following deposition conditions: a deposition pressure of approximately 5.0 torr; a silane flow rate of approximately 300 sccm; a nitrous oxide flow rate of approximately 92 sccm; a nitrogen flow rate of approximately 3900 sccm; an RF power of approximately 520 watts; a spacing of approximately 475 mils, and a deposition temperature of approximately 400 degrees centigrade. At a photoresist exposure wavelength of approximately 365 nanometers the foregoing silicon oxynitride layer has a refractive index of approximately 2.8 and an absorption coefficient of approximately 0.3.

It should be appreciated that the optical properties of copper barrier layer 40 and antireflective layer 41 may be individually tailored by adjusting their respective deposition processes. For example, if the silane flow rate used to deposit antireflective layer 41, discussed above, is changed to approximately 330 sccm this results in the silicon oxynitride layer having an absorption coefficient of approximately 0.40 at a photoresist exposure wavelength of approximately 365 nanometers. The absorptive coefficient of antireflective layer 41 increases because the higher silane flow rate increases the silicon concentration in the silicon oxynitride layer. Similarly, decreasing the silane flow rate will decrease the silicon concentration in the silicon oxynitride layer and decrease its absorption coefficient. Therefore, the optical properties of antireflective layer 41 and copper barrier layer 40 can be independently tailored. For example, copper barrier layer 40 can be formed to have a silicon concentration which is less than the silicon concentration of antireflective layer 41, and thus copper barrier layer 40 can have an absorptive coefficient which is less than that of antireflective layer 41 for the same photoresist exposure wavelength. In addition, it is noted that components other than silicon, oxygen, and nitrogen may be included in the silicon oxynitride layers used to form copper barrier layer 40 and antireflective layer 41. Furthermore, components other than silicon and nitrogen may be included in the silicon nitride layer used to form copper barrier layer 40. For example, hydrogen may be present in these nitride layers.

Figure 4:
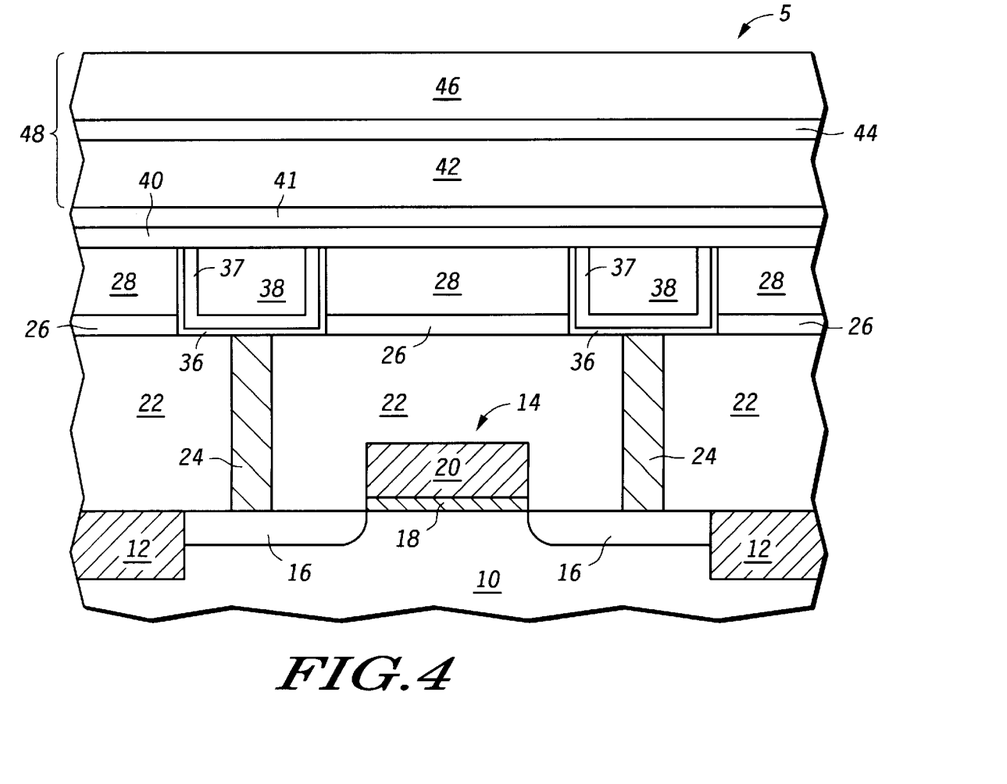

An interlevel dielectric layer 48 is formed overlying antireflective layer 41. In one embodiment, interlevel dielectric layer 48 comprises dielectric layer 42, etch stop layer 44 and dielectric layer 46, as shown in FIG. 4.

Dielectric layer 42 may be a layer of plasma deposited oxide which is deposited using TEOS as a source gas. Alternatively, dielectric layer 42 may be a layer of PSG, a layer of BPSG, an SOG layer, a polyimide layer, a low dielectric constant insulator, or the like.

Etch stop layer 44 may be a layer of plasma deposited silicon oxynitride. Alternatively, etch stop layer 44 may be a layer of plasma deposited silicon nitride, a layer of born nitride, or the like.

Dielectric layer 46 may be a layer of plasma deposited oxide which is formed using TEOS as a source gas. Alternatively, dielectric layer 46 may be a layer of PSG, a layer of BPSG, an SOG layer, a polyimide layer, a low dielectric constant insulator, or the like. It should be appreciated that interlevel dielectric layer 48 need not be formed using different dielectric material. For example, interlevel dielectric layer 48 could be formed using a single dielectric material, such as plasma deposited oxide, PSG, BPSG, SOG, polyimide, a low dielectric constant insulator, or the like.

Figure 5:
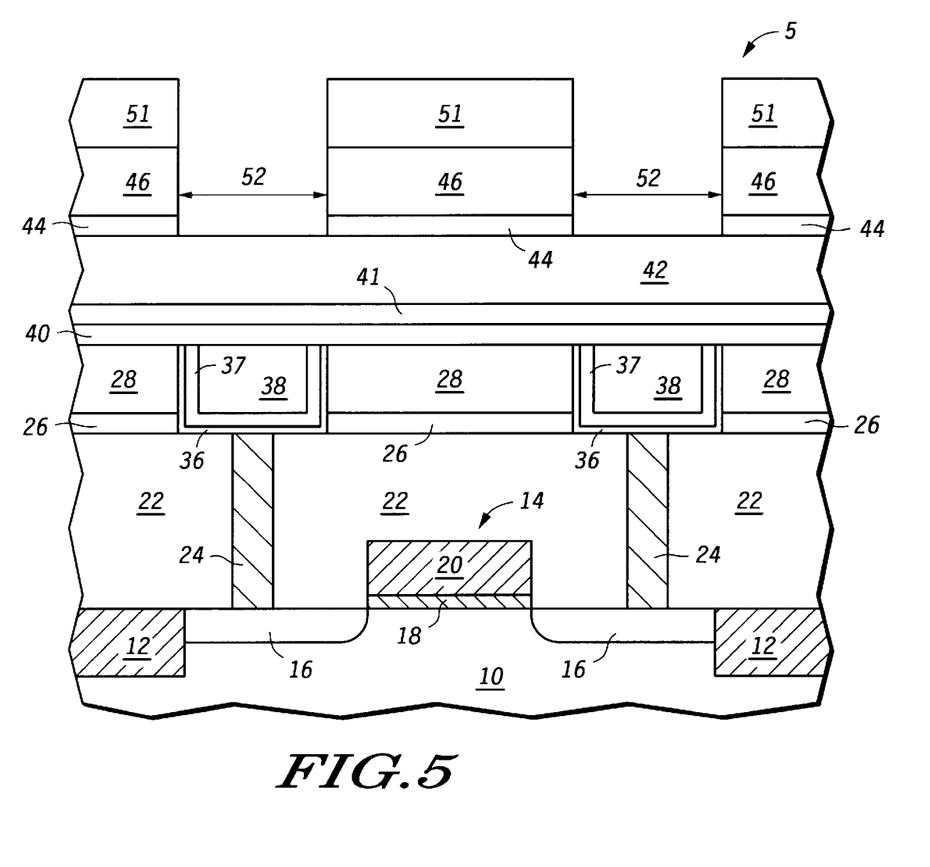

A photoresist mask 51 is then formed overlying dielectric layer 48. Photoresist mask 51 is formed using electromagnetic radiation having a selected photoresist exposure wavelength, such as 365 nanometers or 248 nanometers. It is important to note that antireflective layer 41 reduces reflective notching in photoresist mask 51 which can result when photoresist overlying highly reflective copper interconnects 39 is lithographically exposed. Photoresist mask 51 is then used to pattern a portion of underlying dielectric layer 48, as shown in FIG. 5. More specifically, a portion of dielectric layer 46 and etch stop layer 44 are removed to form an interconnect opening 52 within dielectric layer 48. Photoresist mask 51 is then removed after interconnect opening 52 has been formed.

Figure 6:
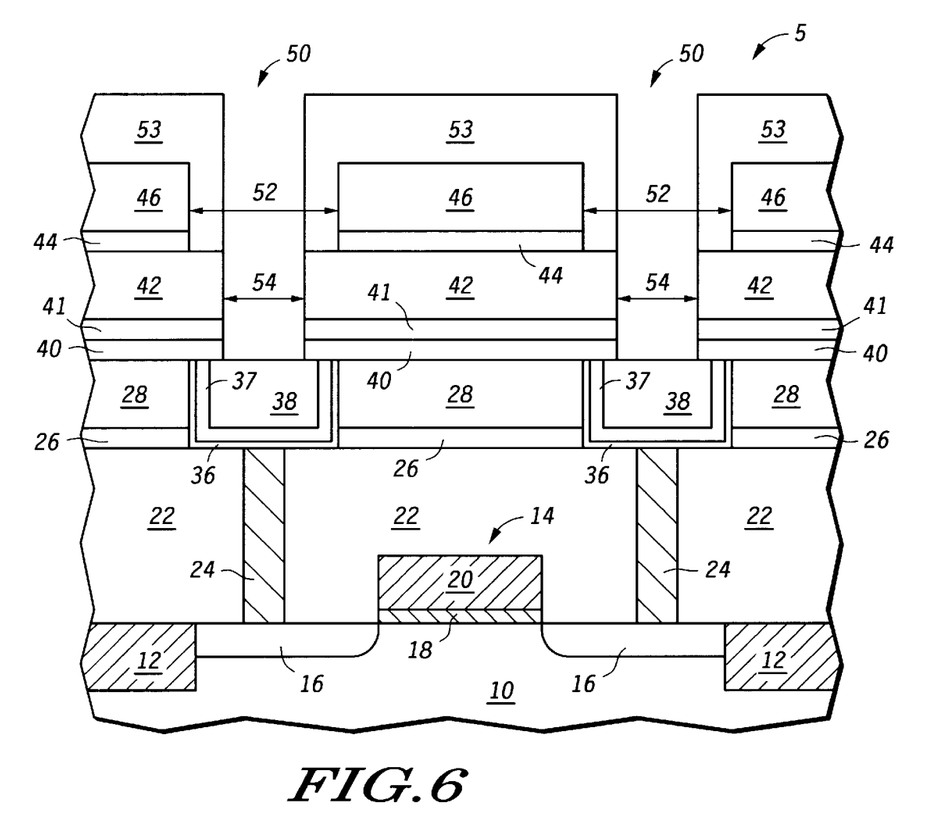

In FIG. 6, a photoresist mask 53 is then formed overlying dielectric layer 48. Photoresist mask 53 is formed using electromagnetic radiation having a selected photoresist exposure wavelength, such as 365 nanometers or 248 nanometers. It is important to note that antireflective layer 41 reduces reflective notching in photoresist mask 53 which can result when photoresist overlying highly reflective copper interconnects 39 is lithographically exposed. Photoresist mask 53 is then used to pattern a portion of underlying dielectric layer 48, as shown in FIG. 6. More specifically, a portion of dielectric layer 42, antireflective layer 41, and copper barrier layer 40 are removed to form a via opening 54 that exposes a portion of copper interconnects 39. This also results in the formation of a dual inlaid opening 50 within dielectric layer 48, wherein dual inlaid opening 50 comprises interconnect portion 52 and via portion 54. Photoresist mask 53 is then removed after dual inlaid opening 50 has been formed within dielectric layer 48.

Figure 7:
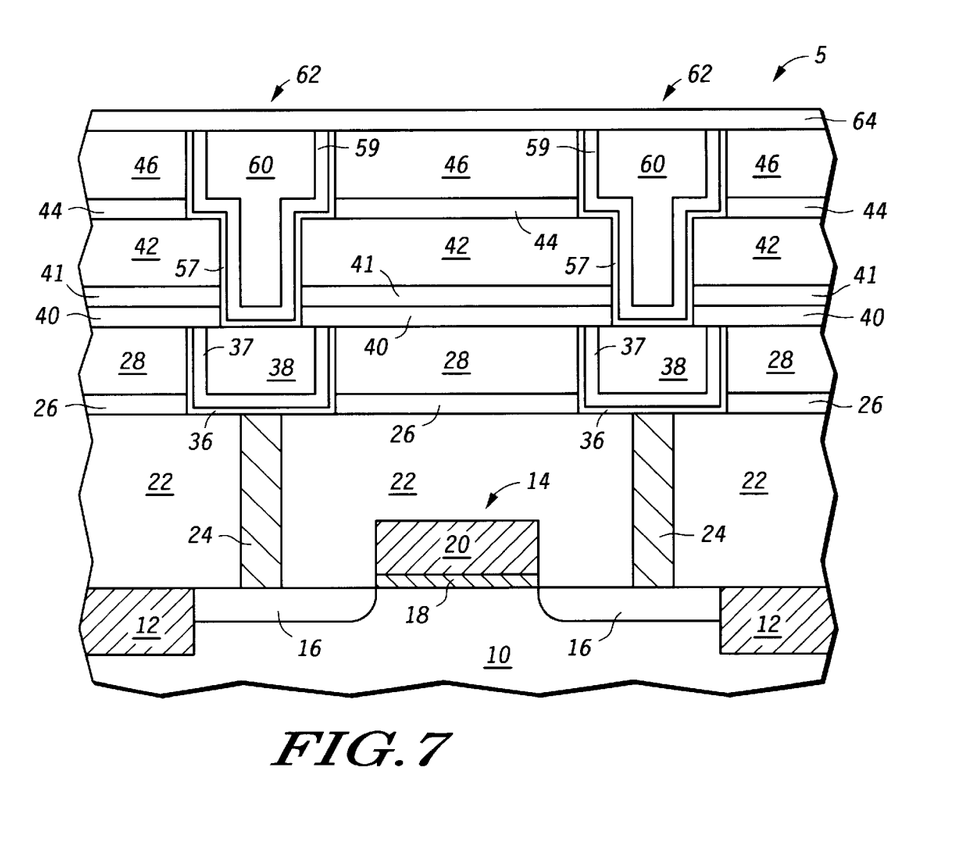

In FIG. 7, a second conductive barrier layer is then formed within dual inlaid openings 50. In one embodiment, the second conductive barrier layer is a layer of tantalum nitride. Alternatively, the second conductive barrier layer may be a layer of titanium nitride, a layer of tungsten nitride, a layer of tantalum silicon nitride, a layer of tantalum, a titanium—tungsten layer (TiW), or the like. The second conductive barrier layer may be deposited using conventional sputtering or chemical vapor deposition techniques.

A third copper layer is then formed overlying the second conductive barrier layer. The third copper layer has a thickness which is insufficient to fill dual in-laid openings 50, as shown in FIG. 7. In one embodiment, the third copper layer is formed using a sputter deposition process. Alternatively, the third copper layer may be formed using a chemical vapor deposition process.

An electroplating process is then used to form a fourth copper layer overlying the third copper layer. The fourth copper layer has a thickness which is sufficient to fill dual inlaid opening 50. In one embodiment, the fourth copper layer is deposited using a plating solution comprising copper (Cu), copper sulfate ($Cu_2SO_4$), sulfuric acid ($H_2SO_4$), and chloride ions, such as those from hydrochloric acid (HCl). In this particular embodiment, the electric current density is modified near the edges of the semiconductor substrate during the copper electroplating process in order to improve the copper electroplating uniformity, as is described in U.S. patent application Ser. No. 08/856,459, which is assigned to the assignee of the present application. The subject matter of U.S. patent application Ser. No. 08/856,459 is expressly incorporated herein by reference. Alternatively, the fourth copper layer may be formed using other electroplating techniques and other electroplating solutions. In addition, the fourth copper layer may be formed using other techniques, such as chemical vapor deposition.

Portions of fourth copper layer, the third copper layer and the second conductive barrier layer are then removed to form copper interconnects 62 within dual inlaid openings 50, wherein copper interconnects 62 comprise a remaining portion 57 of the second conductive barrier layer, a remaining portion 59 of the third copper layer, and a remaining portion 60 of the fourth copper layer. In particular embodiments wherein the second conductive barrier layer comprises titanium, tungsten, or tantalum, copper interconnects 62 may be formed with a chemical mechanical polishing process that uses a polishing slurry comprising hydrogen peroxide, ammonium citrate, alumina, 1,2,4-triazole, and deionized water, as is described in U.S. patent application Ser. No. 08/954,190, which is assigned to the assignee of the present application. The subject matter of U.S. patent application Ser. No. 08/954,190 is expressly incorporated herein by reference. Alternatively, copper interconnects 62 may be formed using conventional etching techniques, such as ion-beam milling, reactive ion-beam etching, and plasma etching, or using a combination of etching and polishing techniques.

A copper barrier layer 64 comprising silicon and nitrogen is then formed overlying copper interconnects 62, as previously described in FIG. 3. If additional levels of interconnect are not required, then copper barrier layer 64 serves as a final device passivation layer and bond pad openings (not shown) are subsequently formed through it. Alternatively, if additional levels of interconnect are required then the steps described in FIG. 3 through FIG. 7 are repeated.

Thus it is apparent that there has been provided, in accordance with the present invention, a metallization process that allows semiconductor devices to be reliability fabricated using copper interconnects. Although the invention has been described and illustrated with reference to specific embodiments, it is not intended that the invention be limited to these illustrative embodiments. Those skilled in the art will recognize that modifications and variations may be made without departing from the spirit and scope of the invention. Therefore, it is intended that this invention encompass all variations and modifications as fall within the scope of the appended claims.

What is claimed is:

1. A method for forming a copper interconnect structure within a semiconductor device comprising the steps of:
   providing a semiconductor substrate;
   forming a first dielectric layer overlying the semiconductor substrate;
   patterning the first dielectric layer to form a first opening and a second opening within the first dielectric layer;
   forming a copper layer, the copper layer lying within the first opening and the second opening;
   removing a portion of the copper layer to form a first copper interconnect within the first opening and a second copper interconnect within the second opening;
   exposing a portion of the first copper interconnect and a portion of the second copper interconnect to a plasma consisting essentially of hydrogen and nitrogen;
   forming a first silicon oxynitride layer overlying the first copper interconnect and the second copper interconnect after the step of exposing the first copper interconnect and the second copper interconnect to the plasma, the first silicon oxynitride layer having a first absorptive coefficient;
   forming a second silicon oxynitride layer abutting the first silicon oxynitride layer, the second silicon oxynitride layer having a second absorptive coefficient;
   forming a second dielectric layer overlying the second silicon oxynitride layer;
   forming a photoresist mask overlying the second dielectric layer, wherein the photoresist mask is formed using electromagnetic radiation, the electromagnetic radiation having an exposure wavelength, wherein the first absorptive coefficient is less than the second absorptive coefficient at the exposure wavelength; and
   using the photoresist mask to pattern the second dielectric layer.

2. The method of claim 1, wherein the second silicon oxynitride layer is further characterized as having a thickness ranging from 5 to 100 nanometers.

3. The method of claim 1, wherein the first silicon oxynitride layer is further characterized as having a first silicon concentration, and the second silicon oxynitride layer is further characterized as having a second silicon concentration, wherein the first silicon concentration is less than the second silicon concentration.

4. The method of claim 1, wherein the first silicon oxynitride layer is further characterized as having an absorptive coefficient ranging from approximately 0.0 to approximately 0.15 at the exposure wavelength.

5. The method of claim 4, wherein the second silicon oxynitride layer is further characterized as having an absorptive coefficient ranging from approximately 0.2 to approximately 1.0 at the exposure wavelength.

6. The method of claim 5, wherein the exposure wavelength is approximately 365 nanometers.

7. The method of claim 5, wherein the exposure wavelength is approximately 248 nanometers.

8. A method for forming a semiconductor device comprising the steps of:
   providing a semiconductor substrate;
   forming a first copper interconnect and a second copper interconnect overlying the semiconductor substrate;
   exposing a portion of the first copper interconnect and a portion of the second copper interconnect to a plasma consisting essentially of hydrogen and nitrogen;
   forming a silicon nitride layer overlying the first copper interconnect and the second copper interconnect after the step of exposing the first copper interconnect and the second copper interconnect to the plasma, the silicon nitride layer having a first absorptive coefficient;
   forming a silicon oxynitride layer abutting the silicon nitride layer, the silicon oxynitride layer having a second absorptive coefficient;
   forming a dielectric layer overlying the silicon oxynitride layer;
   forming a photoresist mask overlying the dielectric layer, wherein the photoresist mask is formed using electromagnetic radiation, the electromagnetic radiation having an exposure wavelength wherein the first absorptive coefficient is less than the second absorptive coefficient at the exposure wavelength; and
   using the photoresist mask to pattern the dielectric layer.

9. The method of claim 8, wherein the silicon oxynitride layer is further characterized as having a thickness ranging from 5 to 100 nanometers.

10. The method of claim 8, wherein the silicon nitride layer is further characterized as having an absorptive coefficient ranging from approximately 0.0 to approximately 0.15 at the exposure wavelength.

11. The method of claim 10, wherein the silicon oxynitride layer is further characterized as having an absorptive coefficient ranging from approximately 0.2 to approximately 1.0 at the exposure wavelength.

12. The method of claim 11, wherein the exposure wavelength is approximately 365 nanometers.

13. The method of claim 11, wherein the exposure wavelength is approximately 248 nanometers.

* * * * *